(12) United States Patent
Bailly

(10) Patent No.: US 11,588,190 B2
(45) Date of Patent: Feb. 21, 2023

(54) ELECTRIC BATTERY RECHARGE METHOD

(71) Applicant: STMicroelectronics (Tours) SAS, Tours (FR)

(72) Inventor: Emmanuel Bailly, Fondettes (FR)

(73) Assignee: STMicroelectronics (Tours) SAS, Tours (FR)

( * ) Notice: Subject to any disclaimer, the term of this patent is extended or adjusted under 35 U.S.C. 154(b) by 499 days.

(21) Appl. No.: 16/410,446

(22) Filed: May 13, 2019

(65) Prior Publication Data
US 2019/0356136 A1    Nov. 21, 2019

(30) Foreign Application Priority Data
May 16, 2018    (FR) ...................... 1854092

(51) Int. Cl.
| | |
|---|---|
| *G01R 19/165* | (2006.01) |
| *H01M 10/0525* | (2010.01) |
| *H01M 10/0562* | (2010.01) |
| *H01M 10/44* | (2006.01) |
| *H02J 7/00* | (2006.01) |

(52) U.S. Cl.
CPC ...... *H01M 10/44* (2013.01); *G01R 19/16528* (2013.01); *H01M 10/0525* (2013.01); *H01M 10/0562* (2013.01); *H02J 7/007* (2013.01); *H02J 7/00714* (2020.01)

(58) Field of Classification Search
CPC .............. H02J 7/007; G01R 19/16528; H01M 10/0525
USPC .......................................................... 320/137
See application file for complete search history.

(56) References Cited

U.S. PATENT DOCUMENTS

| | | | |
|---|---|---|---|
| 5,576,608 A | 11/1996 | Nagai et al. | |
| 2012/0268060 A1* | 10/2012 | Chen .................... | H02J 7/00711 320/107 |
| 2014/0035530 A1* | 2/2014 | Shao ..................... | H02J 7/0029 320/109 |
| 2016/0020618 A1* | 1/2016 | Yang ........................ | H02J 7/02 320/162 |
| 2016/0089994 A1* | 3/2016 | Keller ............... | H02J 7/007192 320/153 |
| 2017/0346329 A1* | 11/2017 | Shi .......................... | H02J 7/007 |
| 2021/0057919 A1* | 2/2021 | Subbotin ............... | H01M 10/44 |

FOREIGN PATENT DOCUMENTS

| | | |
|---|---|---|
| JP | 2010-252474 A | 11/2010 |
| JP | 2014-39400 A | 2/2014 |

* cited by examiner

*Primary Examiner* — Suchin Parihar
(74) *Attorney, Agent, or Firm* — Seed Intellectual Property Law Group LLP

(57) ABSTRACT

A method and system of recharging an electric battery, include an alternation of phases of recharge at a constant current and of phases of recharge at constant voltage.

17 Claims, 4 Drawing Sheets

ELECTRIC BATTERY RECHARGE METHOD

CROSS-REFERENCE TO RELATED APPLICATION

This application claims the priority benefit of French Patent application number 18/54092, filed on May 16, 2018, the content of which is hereby incorporated by reference in its entirety to the maximum extent allowable by law.

BACKGROUND

Technical Field

The present disclosure relates to a method of recharging an electric battery and particularly a thin-film battery or microbattery.

Description of the Related Art

Terms thin-film battery or microbattery are conventionally used to designate a device including a stack of layers forming an active battery element, the stack particularly including an electrolyte layer between a negative electrode (anode) and a positive electrode (cathode). The total thickness of a microbattery is typically in the range from a few tens to a few hundreds of µm, for a surface area in the range from a few mm$^2$ to a few cm$^2$, which enables to house the battery in very small spaces and further enables the manufacture of more or less flexible batteries.

Solid electrolyte microbatteries, and particularly lithium-ion type solid electrolyte microbatteries, are herein more particularly considered. A lithium-ion type solid electrolyte microbattery includes a stack of a positive electrode or cathode, for example, made of lithium cobalt dioxide ($LiCoO_2$), of a solid electrolyte layer, for example made of lithium phosphorus oxynitride (LiPON), and of a negative electrode or anode, for example, made of lithium, the assembly being coated with an encapsulation layer only leaving access to a positive terminal and a negative terminal of the battery.

During battery discharge phases, a current flows from the positive terminal to the negative terminal of the battery, through a load to be powered. During battery recharge phases, a charger applies to the battery a current flowing from the negative terminal to the positive terminal of the battery (through the charger).

It would be desirable to be able to decrease the time necessary to recharge such a battery.

BRIEF SUMMARY

Thus, an embodiment provides a method of recharging an electric battery, including an alternation of phases of recharge at constant current and phases of recharge at constant voltage.

According to an embodiment, the phases of recharge at constant current and the phases of recharge at constant voltage have predetermined durations.

According to an embodiment, the duration of each phase of recharge at constant current is set before the beginning of said phase according to a value of the current measured in the battery at the end of the previous phase of recharge at constant voltage.

According to an embodiment, the intensity of the recharge current applied to the battery at each phase of recharge at constant current is set before the beginning of said phase according to a value of the current measured in the battery at the end of the previous phase of recharge at constant voltage.

According to an embodiment, the quantity of charges injected into the battery at each phase of recharge at constant current is a decreasing function of the current measured in the battery at the end of the previous phase of recharge at constant voltage.

According to an embodiment, the phases of recharge at constant voltage all have substantially the same duration.

According to an embodiment, the recharge is interrupted when the current measured in the battery at the end of a phase of recharge at constant voltage reaches a predetermined low threshold.

According to an embodiment, each phase of recharge at constant current is separated from the next phase of recharge at constant voltage by a rest phase.

Another embodiment is a system including an electric battery and, connected to the battery, a recharge device configured to implement the recharge methods defined herein.

According to an embodiment, the battery is a lithium ion type solid electrolyte microbattery.

The foregoing and other features and advantages will be discussed in detail in the following non-limiting description of specific embodiments in connection with the accompanying drawings.

DETAILED DESCRIPTION

Figure 1:
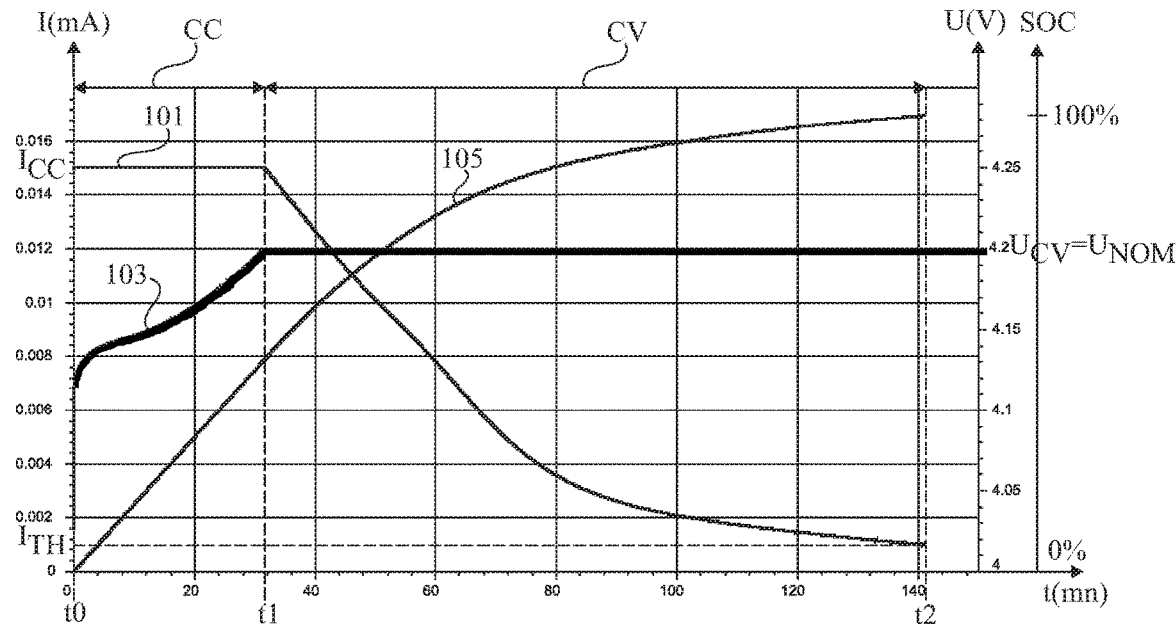
FIG. 1 is a timing diagram illustrating an example of an electric battery recharge method.

The same elements have been designated with the same reference numerals in the various drawings and, further, the various drawings are not to scale. For clarity, only those steps and elements which are useful to the understanding of the described embodiments have been shown and are detailed. In particular, the forming of an electronic charge management device capable of implementing the provided recharge methods has not been detailed, with the structures for forming of such a device being within the abilities of those skilled in the art based on the functional operation of the present description. Unless otherwise specified, expressions "approximately", "substantially", and "on the order of" mean to within 10%, preferably to within 5%.

FIG. 1 is a timing diagram illustrating an example of an electric battery recharge method. In this example, the recharged battery is a lithium-ion type solid electrolyte microbattery, having a capacity $C_{tot}$ on the order of 0.0170 mAh and a nominal voltage $U_{NOM}$ (in the charged state) on the order of 4.2 V. FIG. 1 more particularly includes:

a curve 101 showing the variation over time t (abscissa, in minutes) of recharge current I (ordinate on the left-hand side of FIG. 1, in mA) applied to the battery;

a curve 103 showing the variation over time t of voltage U (ordinate on the right-hand side in volts V) across the battery; and a curve 105 showing the variation over time t of the state of charge SOC (ordinate on the right-hand side in a percentage) of the battery, that is, the ratio of the quantity of charge contained in the battery to the maximum charge storage capacity $C_{tot}$ of the battery.

The method of FIG. 1 is a CC-CV type recharge method, that is, it includes an initial phase of recharge at constant current (CC), followed by a phase of recharge at constant voltage (CV). In the illustrated example, at a time t0 at the beginning of the recharge method, the battery is in a fully discharged state. The voltage of the battery in the discharged state is for example on the order of 3 V (not shown in FIG. 1).

The time t0 corresponds to the beginning of the phase of recharge at constant current CC. From time t0, an electronic recharge device (not detailed) applies to the battery a substantially constant recharge current $I_{CC}$, on the order of 0.015 mA in the present example. Under the effect of current $I_{CC}$, the battery charges and a voltage U thereacross continuously increases. During recharge phase CC, the recharge device monitors the variation of voltage U across the battery. At a time t1 subsequent to time t0, on the order of t0+32 minutes in the present example, voltage U of the battery reaches the nominal full charge voltage $U_{NOM}$ of the battery. Time t1 marks the end of the phase of recharge at constant current CC and the beginning of the phase of recharge at constant voltage CV.

From time t1, the recharge device applies to the battery a substantially constant recharge voltage $U_{CV}$, equal to the nominal full charge voltage $U_{NOM}$ of the battery. Under the effect of this voltage, the battery keeps on charging and the recharge current flowing through the battery continuously decreases. During recharge phase CV, the recharge device monitors the variation of recharge current I flowing through the battery. At a time t2 subsequent to time t1, on the order of t0+142 minutes in this example, the current I flowing through the battery reaches a predetermined low threshold $I_{TH}$, on the order of 0.001 mA in this example, below which the battery is considered fully charged. The time t2 marks the end of the CC-CV battery recharge method.

Figure 2:
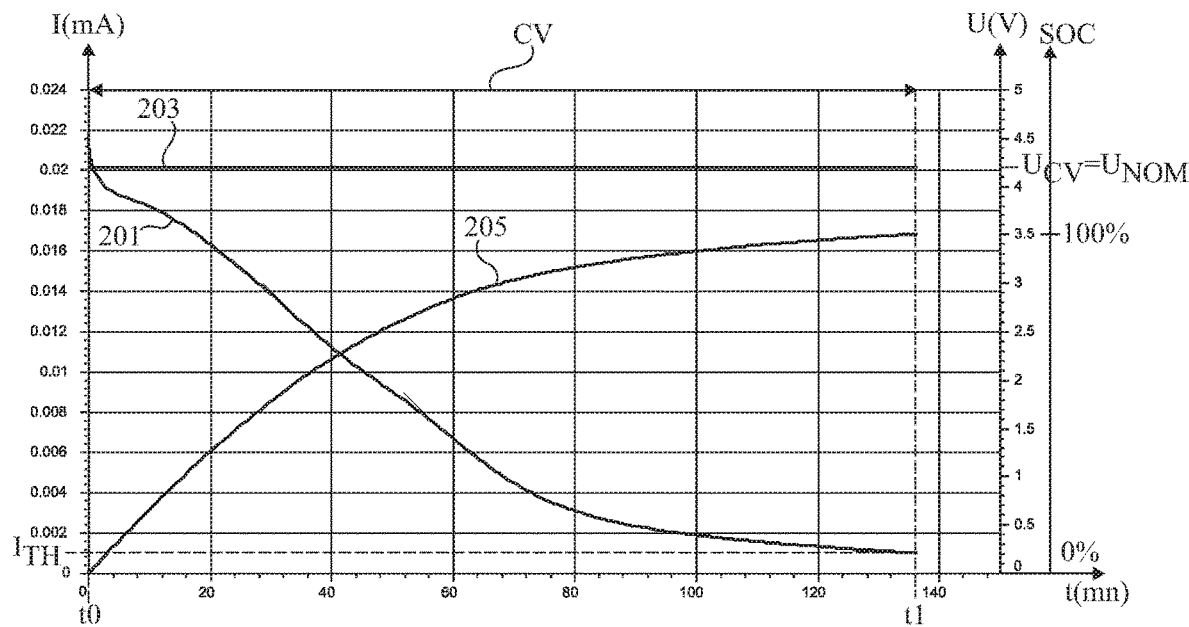
FIG. 2 is a timing diagram illustrating another example of an electric battery recharge method.

FIG. 2 is a timing diagram illustrating another example of an electric battery recharge method. In this example, the recharged battery is identical to that of the example of FIG. 1. FIG. 2 more particularly includes:

a curve 201 showing the variation over time t (abscissas, in minutes), of recharge current I (ordinate on the left-hand side, in mA) applied to the battery;

a curve 203 showing the variation over time t of voltage U (ordinate on the right-hand side, in volts V) across the battery; and a curve 205 showing the variation over time t of the state of charge SOC (ordinate on the right-hand side, in a percentage) of the battery.

The method of FIG. 2 is a CV-type method, that is, it includes a single phase of recharge at constant voltage (CV). In the illustrated example, at a time t0 of beginning of the recharge, the battery is in a fully discharged state. The battery voltage in the discharged state is for example on the order of 3 V.

From time t0, an electronic recharge device (not detailed) applies to the battery a substantially constant recharge voltage $U_{CV}$, equal to the nominal full charge voltage $U_{NOM}$ of the battery. Under the effect of this voltage, the battery recharges. The recharge current flowing through the battery continuously decreases as the battery charges. During recharge phase CV, the recharge device monitors the variation of recharge current I flowing through the battery. At a time t1 subsequent to time t0, on the order of t0+136 min in this example, recharge current I flowing through the battery reaches a predetermined low threshold $I_{TH}$, on the order of 0.001 mA in this example, below which the battery is considered as fully charged. The time t1 marks the end of the battery recharge phase.

A disadvantage of the recharge methods described in relation with FIGS. 1 and 2 is that they are relatively slow. The time necessary to fully recharge the battery is approximately 2 h22 in the example of FIG. 1, and approximately 2 h16 in the example of FIG. 2.

Figure 3:
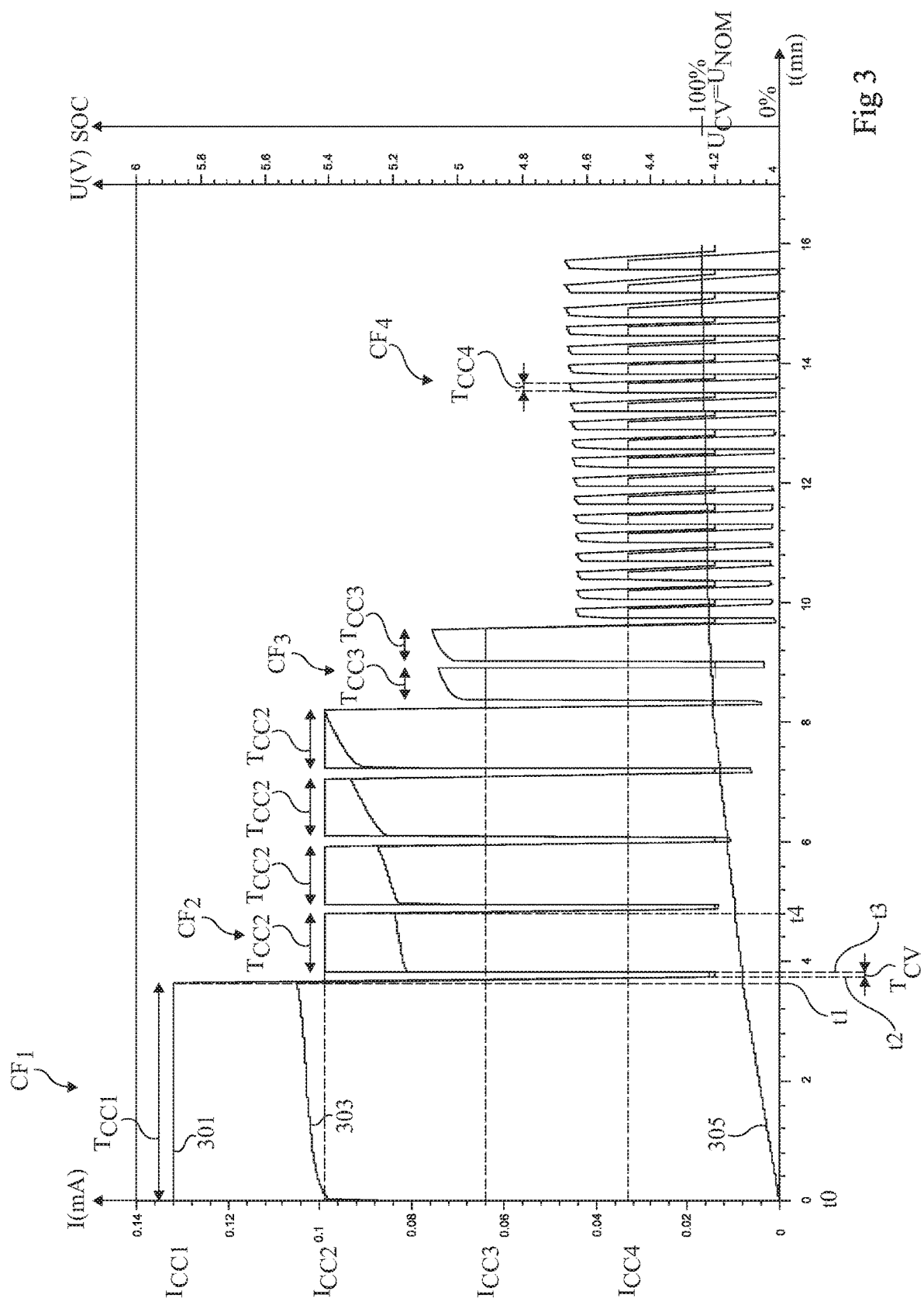
FIG. 3 is a timing diagram illustrating an example of an electric battery recharge method according to an embodiment of the present disclosure.

FIG. 3 is a timing diagram illustrating an example of an electric battery discharge method according to an embodiment. In this example, the recharged battery is identical to that of the examples of FIGS. 1 and 2. FIG. 3 more particularly includes:

a curve 301 showing the variation over time t (in abscissas, in minutes), of recharge current I (ordinate on the left-hand side, in mA) applied to the battery;

a curve 303 showing the variation over time t of voltage U (ordinate on the right-hand side in volts V) across the battery; and a curve 305 showing the variation over time t of the state of charge SOC (ordinate on the right-hand side in percentage) of the battery.

The recharge method of FIG. 3 may be implemented by an electronic recharge device, not detailed, capable of controlling the voltage and the current applied to the battery, and of measuring the voltage across the battery and the current flowing through the battery according to signal diagram of FIG. 3.

The method of FIG. 3 includes an alternation of phases of recharge at constant or substantially constant current and of phases of recharge at constant or substantially constant voltage. In this example, the phases of recharge at constant current and the phases of recharge at constant voltage have predetermined durations, that is, the duration of each phase of recharge at constant current is set before the beginning of said phase, and the duration of each phase of recharge at constant voltage is set before the beginning of said phase.

In the illustrated example, at a time t0 at the beginning of the recharge method, the battery is in a fully discharged state. The voltage of the battery in the discharged state is, for example, on the order of 3 V (not shown in FIG. 3).

From time t0, a first phase of recharge at constant current is implemented. During this phase, of predetermined duration $T_{CC1}$, the recharge device applies a constant recharge current $I_{CC1}$ to the battery.

At a time $t1=t0+T_{CC1}$, marking the end of the first phase of recharge at constant current, the recharge device interrupts the recharge current, and the battery is left at rest (under a zero current) for a short period, on the order of a few seconds, until a time t2.

From time t2, a first phase of recharge at constant voltage is implemented. During this phase, of predetermined duration $T_{CV}$ on the order of a few seconds, the recharge device applies to the battery a substantially constant recharge voltage $U_{CV}$, substantially equal to the nominal full charge voltage $U_{NOM}$ of the battery in the present example.

At a time $t3=t2+T_{CV}$, the recharge device measures the recharge current $I_{CV}$ flowing through the battery. Time t3 marks the end of the first phase of recharge at constant voltage and the beginning of a second phase of recharge at constant current of predetermined duration $T_{CC2}$.

The duration $T_{CC2}$ of the second phase of recharge at constant current and the value $I_{CC2}$ of the recharge current applied during the second phase of recharge at constant current are selected by the recharge device according to the value of the recharge current $I_{CV}$ measured at the end of the first phase of recharge at constant voltage.

The previously-described steps (recharge at constant current/rest/recharge at constant voltage) are repeated, in this order, until the recharge current $I_{CV}$ measured at the end of the phase of recharge at constant voltage falls below a predetermined low threshold $I_{TH}$, on the order of 0.001 mA in this example, below which the battery is considered as fully charged.

For each iteration of the above-mentioned step sequence, the duration of the phase of recharge at constant current and the value of the recharge current applied during the phase of recharge at constant current are selected by the recharge device according to the value of current $I_{CV}$ measured at the end of the previous phase of recharge at constant voltage, to decrease the quantity of charges injected into the battery for each phase of recharge at constant current, as current $I_{CV}$ decreases.

In the illustrated example, the characteristics of each phase of recharge at constant current, that is, the duration and the intensity of the applied recharge current, are selected from among N configurations $CF_1, \ldots CF_N$, where N is an integer greater than or equal to 1 and preferably greater than or equal to 2, and being equal to 4 in the illustrated example. Each configuration $CF_i$, i being an integer in the range from 1 to N, corresponds to a specific duration $T_{CCi}$ of the phase of recharge at constant current and to a specific intensity $I_{CCi}$ of the current applied during said phase, such that the quantity of charges injected into the battery during the phase of recharge at constant current is smaller as index i of the configuration is higher, that is, such that $T_{CC1}*I_{CC1} > T_{CC2}*I_{CC2} > \ldots > T_{CCN}*I_{CCN}$.

In the illustrated example, the duration of each phase of recharge at constant current is shorter as index i is higher ($T_{CC1} > T_{CC2} > \ldots > T_{CCN}$), and the intensity $I_{CCi}$ of the current applied during the phase of recharge at constant current is smaller as index i is higher ($I_{CC1} > I_{CC2} > \ldots > I_{CCN}$). The described embodiments are however not limited to this specific case.

To select the characteristics of each phase of recharge at constant current from among the N configurations $CF_1, \ldots CF_N$, the current $I_{CV}$ measured at the end of the previous phase of recharge at constant voltage is compared with a set of N predetermined current thresholds $S_1, \ldots S_N$, with $S_1 > S_2 > \ldots > S_N$, and $S_N = I_{TH}$ (threshold below which the battery is considered as fully charged).

If current $I_{CV}$ is greater than threshold S1, the recharge device applies a phase of recharge at constant current of type $CF_1$ to the battery.

For i in the range from 2 to N, if current $I_{CV}$ is in the range from threshold $S_{i-1}$ to threshold $S_i$, the recharge device applies a phase of recharge at constant current of type $CF_i$ to the battery.

If current $I_{CV}$ is smaller than threshold $S_N$, the battery is considered as fully charged and the recharge device interrupts the recharge current.

Figure 4:
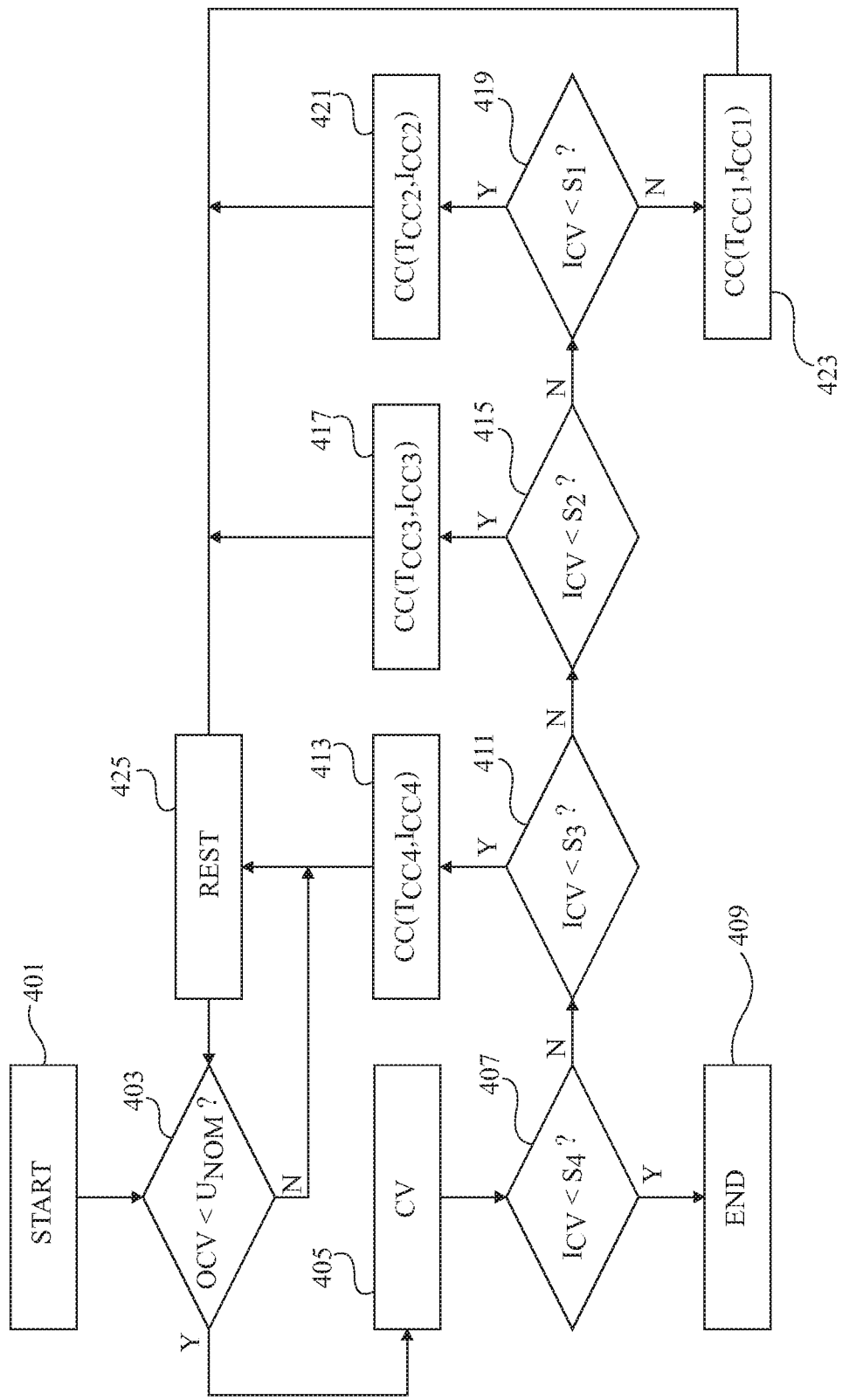
FIG. 4 is a flowchart illustrating an example of an electric battery recharge method according to another embodiment.

FIG. 4 is a flowchart illustrating in further detail, in the form of blocks, an example of implementation of the recharge method of FIG. 3.

During a step 401 (START), the battery recharge device is controlled to implement the battery recharge method. At this stage, the state of charge SOC of the battery may be unknown.

At a step 403 (OCV<$U_{NOM}$?) following step 401, the recharge device measures the open-circuit voltage OCV in open circuit (under a zero current) of the battery, and compares this voltage with the nominal full charge voltage $U_{NOM}$ of the battery.

If, at step 403, the recharge device determines that the open-circuit voltage of the battery is smaller than the nominal full charge voltage ($U_{NOM}$) of the battery (Y), the recharge device implements a step 405 of recharge at constant current (CV) of the battery.

At step 405, the recharge device applies, between the positive voltage and the negative voltage of the battery, a constant recharge voltage, substantially equal to voltage $U_{NOM}$, for a predetermined duration $T_{CV}$ on the order of a few seconds, for example, a duration in the range from 1 to 30 seconds, for example, a duration on the order of 5 seconds. At the end of step 405, the recharge device measures the recharge current $I_{CV}$ flowing through the battery when constant recharge voltage $U_{NOM}$ is applied to the battery.

At a step 407 ($I_{CV}<S_4$?) subsequent to step 405, the recharge device compares the current $I_{CV}$ measured at step 405 with threshold $S_4$.

If, at step 407, the recharge device determines that current $I_{CV}$ is smaller than threshold $S_4$ (Y), the battery is considered as fully charged and the recharge device interrupts the battery recharge at a step 409 (END).

If, at step 407, the recharge device determines that current $I_{CV}$ is greater than or equal to threshold $S_4$ (N), the recharge device compares, at a step 411 ($I_{CV}<S_3$?), the current $I_{CV}$ measured at step 405 with threshold $S_3$.

If, at step 411, the recharge device determines that current $I_{CV}$ is smaller than threshold $S_3$ (Y), the recharge device implements a step 413 (CC($T_{CC4}$, $I_{CC4}$)) of recharge at constant current of type $CF_4$, that is, of duration $T_{CC4}$ and of intensity $I_{CC4}$. In other words, the recharge device applies between the positive terminal and the negative terminal of the battery a constant recharge current of intensity $I_{CC4}$ for a duration $T_{CC4}$.

If, at step 411, the recharge device determines that current $I_{CV}$ is greater than or equal to threshold $S_3$ (N), the recharge device compares, at a step 415 ($I_{CV}<S_2$?), the current $I_{CV}$ measured at step 405 with threshold $S_2$.

If, at step 415, the recharge device determines that current $I_{CV}$ is smaller than threshold $S_2$ (Y), the recharge device implements a step 417 (CC($T_{CC3}$, $I_{CC3}$)) of recharge at constant current of type $CF_3$, that is, of duration $T_{CC3}$ and of intensity $I_{CC3}$.

If, at step 415, the recharge device determines that current $I_{CV}$ is greater than or equal to threshold $S_2$ (N), the recharge device compares, at a step 419 ($I_{CV}<S_1$?), the current $I_{CV}$ measured at step 405 with threshold $S_1$.

If, at step 419, the recharge device determines that current $I_{CV}$ is smaller than threshold $S_1$ (Y), the recharge device implements a step 421 (CC($T_{CC2}$, $I_{CC2}$)) of recharge at constant current of type $CF_2$, that is, of duration $T_{CC2}$ and of intensity $I_{CC2}$.

If, at step 419, the recharge device determines that current $I_{CV}$ is greater than or equal to threshold $S_1$ (N), the recharge device implements a step 423 (CC($T_{CC1}$, $I_{CC1}$)) of recharge at constant current of type $CF_1$, that is, of duration $T_{CC1}$ and of intensity $I_{CC1}$.

At the end of the step of recharge at constant current 413, 417, 421, or 423, the recharge device implements a rest phase 425 (REST) including placing the battery in open circuit for a predetermined duration on the order of a few seconds, for example, a duration in the range from 1 to 30 seconds, for example, a duration on the order of 5 seconds.

At the end of step 425, the method resumes from step 403.

If, at step 403, the recharge device determines that the open-circuit voltage of the battery is greater than or equal to the nominal full-charge voltage $U_{NOM}$ of the battery (N), the method resumes from step 425. In other words, when, at step 403, the recharge device determines that the open-circuit voltage of the battery is greater than or equal to voltage $U_{NOM}$, the recharge device repeats rest step 425 until the open-circuit voltage of the battery falls below voltage $U_{NOM}$.

As appears in FIG. 3, an advantage of the discharge method described in relation with FIGS. 3 and 4 is that it is particularly fast. In the example of FIG. 3, the time necessary for the full recharge of the battery is approximately 16 minutes, to be compared with 2 h22 in the example of FIG. 1 and 2 h16 in the example of FIG. 2 (for an identical battery).

Preferably, to limit the battery recharge time, the recharge currents $I_{CC1}, \ldots, I_{CCN}$ applied during phases of recharge at constant current of the battery are relatively high. As an example, the recharge currents $I_{CC1}, \ldots, I_{CCN}$ applied during phases of recharge at constant current of the battery are in the range from 1C to 10C, where C designates the recharge current to be applied to the battery to achieve a full recharge of the battery within one hour (at constant current).

As appears in FIG. 3, in the method described in relation with FIGS. 3 and 4, the voltage across the battery is capable of rising clearly above the nominal full charge voltage $U_{NOM}$ of the battery during phases of recharge at constant current of the battery. This results from the fact that, in the provided method, the phases of recharge at constant current are not interrupted when the voltage across the battery reaches voltage $U_{NOM}$. This is a difference with a method of CC-CV type as described in relation with FIG. 1, where the phase of recharge at constant current is interrupted when the battery voltage reaches value $U_{NOM}$. Such a recharge mode is made possible by the fact that solid electrolyte batteries can withstand relatively high voltages with no risk of degradation. More generally, the provided method may be applied to any type of battery (not necessarily a thin-film battery and not necessarily with a solid electrolyte) capable of withstanding overvoltages with no risk of degradation.

Figure 5:
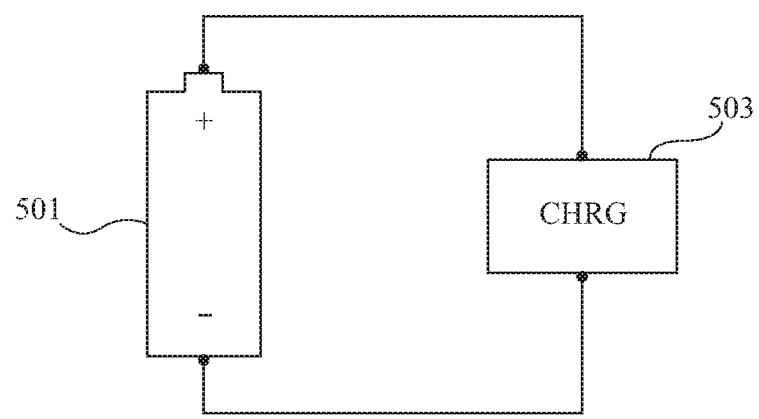
FIG. 5 is a simplified diagram of a system including an electric battery and a recharge device capable of implementing a method of recharging the battery according to another embodiment.

FIG. 5 is a simplified diagram of a system including an electric battery 501, for example, a solid electrolyte lithium ion type microbattery, and connected to the positive (+) and negative (−) terminals of the battery, a recharge device 503 (CHRG) capable of implementing a method of recharging battery 501 such as described in relation with FIGS. 3 and 4. As previously indicated, device 501 is capable of controlling the current (during phases of recharge at constant current) and the voltage (during phases of recharge at constant voltage) applied to the battery, and of measuring the current (at the end of the phases of recharge at constant current) and the voltage (at the end of rest phases) between the positive and negative terminals of the battery. Device 503 may comprise any control circuitry capable of implementing the above-described method, for example, a microcontroller.

Specific embodiments have been described. Various alterations, modifications, and improvements will occur to those skilled in the art. In particular, the described embodiments are not limited to the examples of numerical values or to the examples of materials mentioned in the present description. Furthermore, the various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
    recharging an electric battery with a recharge control circuitry by:
        charging the battery with the recharge control circuitry during a first constant current phase having a first time duration;
        charging the battery with the recharge control circuitry during a first constant voltage phase having a second time duration;
        charging the battery with the recharge control circuitry during a second constant current phase having a third time duration;
        measuring a current through the battery with the recharge control circuitry at an end of the first constant voltage phase; and
        determining the third time duration in response to the measured current.

2. The method of claim 1, comprising setting an intensity of a recharge current during the second constant current phase with the recharge control circuitry before beginning the second constant current phase in response to a value of the measured current.

3. The method of claim 2, comprising injecting a quantity of charges into the battery at the second constant current phase as a decreasing function of the measured current.

4. The method of claim 1, comprising charging the battery with the recharge control circuitry during a second constant voltage phase having a fourth time duration, the second and fourth time duration having substantially the same duration.

5. The method of claim 4, comprising interrupting a third constant current phase in response to the measured current through the battery at an end of the second constant voltage phase reaching a predetermined low threshold.

6. The method of claim 1, comprising executing by the recharge control circuitry a rest phase between the first constant current phase and the first constant voltage phase.

7. A system, comprising:
    an electric battery; and
    a recharge circuit coupled to the electric battery, the recharge circuit configured to:
        apply a first constant current for a first time duration to the electric battery;
        apply a first constant voltage for a second time duration to the electric battery;
        measure a current through the electric battery at an end of the second time duration; and
        apply a second constant current for a third time duration that is set in response to the measured current of the electric battery, the end of the second time duration being immediately before the second constant current.

8. The system of claim 7, wherein the electric battery comprises a lithium-ion type solid electrolyte microbattery.

9. The system of claim 7, wherein the electric battery comprises a thin-film battery having a solid electrolyte, and the thin-film battery configured to withstand overvoltages across the thin-film battery responsive to the constant currents being applied to the thin-film battery.

10. The system of claim 7, wherein the recharge circuit comprises a microcontroller.

11. The system of claim 7, wherein the recharge circuit is further configured to set a time duration of a subsequent constant current in response to a subsequent measured current of the battery at an end of a subsequent constant voltage.

12. The system of claim 11, wherein each of the first constant voltage and the subsequent constant voltage has a same duration.

13. The system of claim 7, wherein the first constant current is separated from the subsequent constant voltage by a rest phase, the recharge circuit configured to place the electric battery in an open-circuit condition during the rest phase.

14. A system, comprising:
a battery charger having a recharge circuit that is configured to:
provide a first constant current phase for a first time duration to a battery;
provide a first constant voltage phase for a second time duration to the battery;
measure a current of the battery at an end of the second time duration;
compare the measured current to a first threshold; and
provide a second constant current phase for a third time duration in response to the measured current being greater than the first threshold, the third time duration being based on the measured current of the battery at the end of the second time duration of the first constant voltage phase.

15. The system of claim 14, wherein the battery charger is further configured to decrease a value of a third constant current supplied during a third constant current phase based on a second measured current in the battery from a preceding second constant voltage phase.

16. The system of claim 14, wherein the recharge circuit is configured to provide a second constant voltage phase for a fourth time duration to the battery and measure a second current of the battery at an end of the fourth time duration.

17. The system of claim 16, wherein the recharge circuit is configured to provide a third constant current phase for a fifth time duration in response to the measured second current.

* * * * *